(12) United States Patent
Song et al.

(10) Patent No.: US 9,795,031 B2
(45) Date of Patent: Oct. 17, 2017

(54) WIRING BOARD, FLEXIBLE DISPLAY PANEL AND DISPLAY DEVICE

(71) Applicant: BOE TECHNOLOGY GROUP CO., LTD., Beijing (CN)

(72) Inventors: Song Song, Beijing (CN); Kazuyoshi Nagayama, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/763,074

(22) PCT Filed: Dec. 3, 2014

(86) PCT No.: PCT/CN2014/092939
§ 371 (c)(1),
(2) Date: Jul. 23, 2015

(87) PCT Pub. No.: WO2016/008254
PCT Pub. Date: Jan. 21, 2016

(65) Prior Publication Data
US 2016/0255719 A1  Sep. 1, 2016

(30) Foreign Application Priority Data
Jul. 17, 2014 (CN) .......................... 2014 1 0342155

(51) Int. Cl.
*H05K 1/02* (2006.01)
*H05K 1/03* (2006.01)
(Continued)

(52) U.S. Cl.
CPC ....... *H05K 1/0393* (2013.01); *G02F 1/13452* (2013.01); *H05K 1/0296* (2013.01);
(Continued)

(58) Field of Classification Search
CPC .... G02F 1/133; H05K 1/0296; H05K 1/0393; H05K 1/115; H05K 3/06; H05K 1/09; H05K 2201/10128
See application file for complete search history.

(56) References Cited

U.S. PATENT DOCUMENTS

2007/0216845 A1   9/2007 Liao et al.
2008/0157364 A1*  7/2008 Yang ..................... G02F 1/1345
                                                            257/741
(Continued)

FOREIGN PATENT DOCUMENTS

CN   1512251 A   7/2004
CN   1743927 A   3/2006
(Continued)

OTHER PUBLICATIONS

First Office Action regarding Chinese application No. 201410342155.3, dated Dec. 17, 2015. Translation provided by Dragon Intellectual Property Law Firm.
(Continued)

*Primary Examiner* — Hoa C Nguyen
(74) *Attorney, Agent, or Firm* — Harness, Dickey & Pierce, P.L.C.

(57) ABSTRACT

The present disclosure discloses a wiring board used to connect a driving chip and a display panel, a flexible display panel and a display device. Signal output ends on the driving chip and signal input ends on the display panel may be arranged in pairs; and the wiring board may include fanout lines each of which is configured to connect a pair of signal output end and the signal input end. The wiring board may include a substrate; a plurality of segments of first connection lines having first resistivity is arranged on a first surface of the substrate; a plurality of segments of second connection lines having second resistivity is arranged on a second surface of the substrate opposite to the first surface. At least
(Continued)

parts of the fanout lines are formed by connecting the first connection lines and the second connection lines.

18 Claims, 4 Drawing Sheets

(51) Int. Cl.
    *H05K 1/09*     (2006.01)
    *H05K 1/11*     (2006.01)
    *H05K 3/06*     (2006.01)
    *G02F 1/1345*     (2006.01)

(52) U.S. Cl.
    CPC ............... *H05K 1/09* (2013.01); *H05K 1/115* (2013.01); *H05K 3/06* (2013.01); *H05K 2201/10128* (2013.01)

(56) References Cited

U.S. PATENT DOCUMENTS

2010/0025690 A1* 2/2010 Kim .................. H01L 27/124
    257/66

2010/0156769 A1* 6/2010 Chang .................. G09G 3/3648
    345/87

2011/0096258 A1     4/2011 Shim et al.

FOREIGN PATENT DOCUMENTS

| CN | 101728344 A | 6/2010 |
|----|-------------|--------|
| CN | 201590281 U | 9/2010 |
| CN | 103149753 A | 6/2013 |
| CN | 103762204 A | 4/2014 |
| CN | 104134406 A | 11/2014 |
| JP | 2012252216 A | 12/2012 |
| KR | 20040107742 A | 12/2004 |

OTHER PUBLICATIONS

Written Opinion of the International Searching Authority for international application No. PCT/CN2014/092939.

Third Office Action regarding Chinese Application No. 201410342155.3, dated Feb. 23, 2017. Translation provided by Dragon Intellectual Property Law Firm.

* cited by examiner

WIRING BOARD, FLEXIBLE DISPLAY PANEL AND DISPLAY DEVICE

CROSS-REFERENCE TO RELATED APPLICATION

This application is the U.S. national phase of PCT Application No. PCT/CN2014/092939 filed on Dec. 3, 2014, which claims a priority of the Chinese Patent Application No. 201410342155.3 filed on Jul. 17, 2014, the disclosures of which are incorporated in their entirety by reference herein.

TECHNICAL FIELD

The present disclosure relates to the field of display technology, in particular to a wiring board used to connect a driving chip and a display panel, a flexible display panel having the wiring board and a display device having the flexible display panel.

BACKGROUND

A display panel of a display device is driven by a driving chip, which is connected with the display panel via a plurality of fanout lines. As electronics technology further advanced, in order to save space, a size of the driving chip becomes smaller and smaller. On the other hand, the display panel has to be designed according to actual needs of users. Generally speaking, a size of the display panel is larger than that of the driving chip.

As the size of the display device becomes larger and larger, a difference among distances between signal output ends on the driving chip and signal input ends on the display panel becomes bigger and bigger, which results in that a difference among lengths of fanout lines connecting signal output ends and signal input ends becomes bigger and bigger. Due to lengths of respective fanout lines being different, resistivity of the fanout lines are different too, which results in a delay problem when signals are transmitted through fanout lines and more adverse impact on the uniformity of the display panel.

SUMMARY

Embodiments of the present disclosure provide a wiring board used to connect a driving chip and a display panel, a flexible display panel having the wiring board, and a display device having the flexible display panel, so as to solve the following problems, including: unmatched sizes for conventional driving chip and display panel, which results in different lengths and resistivity for different fanout lines, thereby imposing adverse impact on the uniformity of the display panel.

According to an aspect of the present disclosure, there provides a wiring board which is used to connect a driving chip and a display panel. Specifically, signal output ends on the driving chip and signal input ends on the display panel may be arranged in pairs; and the wiring board may include fanout lines each of which is configured to connect a pair of signal output end and the signal input end. Moreover, the wiring board may include a substrate; a plurality of segments of first connection lines having first resistivity may be arranged on a first surface of the substrate; a plurality of segments of second connection lines having second resistivity may be arranged on a second surface of the substrate opposite to the first surface; and at least parts of the fanout lines may be formed by connecting the first connection lines and the second connection lines.

Alternatively, a predetermined angle may be formed between at least parts of adjacent segments of the connection lines of the fanout lines.

Alternatively, the predetermined angle may range from 30 degrees to 150 degrees.

Alternatively, the first connection lines and/or the second connection lines of the fanout lines may be arranged at a certain angle with respect to electrode lines within the display panel.

Alternatively, the first connection lines and the second connection lines of the fanout lines may be connected via a via-hole.

Alternatively, connection lines of a plurality of the fanout lines may at least partially overlap each other at an identical location on the substrate.

Alternatively, the first connection lines may be each made of a material having the first resistivity; and the second connection lines may be each made of a material having the second resistivity other than the first resistivity.

Alternatively, the first connection lines may be copper lines; and the second connection lines may be iron lines.

Alternatively, the substrate may be made of a flexible material.

Alternatively, the flexible material may be resin or plastics.

Alternatively, the plurality of segments of the connection lines of the fanout lines may be formed from a conductive film layer by an etching process.

According to another aspect of the present disclosure, there provided a flexible display panel having any one of the above wiring boards.

According to yet another aspect of the present disclosure, there also provided a display device having the above flexible display panel.

At least the following advantageous effects can be achieved by the embodiments of the present disclosure, including: in embodiments of the present disclosure, at least parts of the fanout lines are formed by connecting the first connection lines and the second connection lines having different resistivity on different surfaces of the substrate. Due to different resistivity between the first connection lines and the second connection lines, the resistivity of respective fanout lines can be controlled, which in turn controls time duration for transmitting signals on respective fanout lines.

DETAILED DESCRIPTION

In order to illustrate the technical problems, the technical solutions and advantageous effects of the present disclosure or the related art in a clearer manner, the drawings desired for the embodiments will be described briefly hereinafter.

Figure 1:
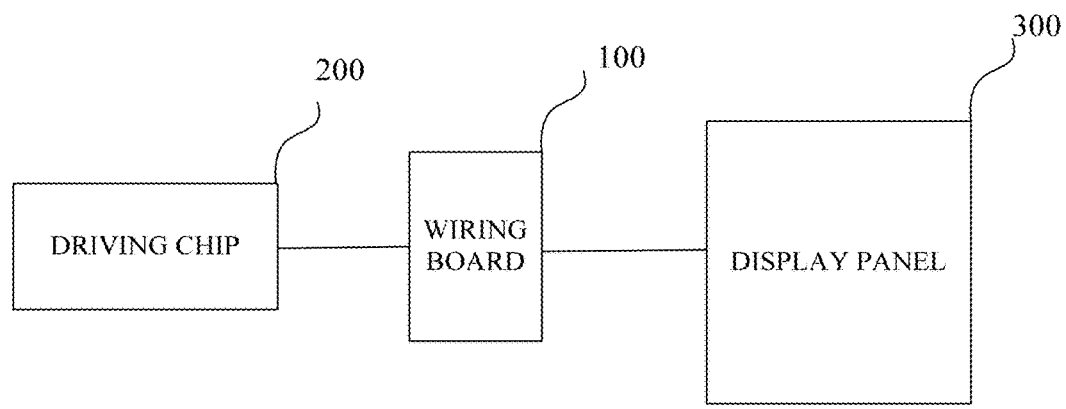
FIG. 1 is a block diagram which illustrates structural relations among a driving chip, a wiring board and a display panel according to an embodiment of the present disclosure.

FIG. 1 is a block diagram which illustrates structural relations among a driving chip, a wiring board and a display panel according to an embodiment of the present disclosure. According to this embodiment, the wiring board 100 is used to connect a driving chip 200 and a display panel 300; signal output ends on the driving chip 200 and signal input ends on the display panel 300 are arranged in pairs. Moreover, the wiring board 100 includes fanout lines each of which is configured to connect a pair of the signal output end and the signal input end; and the fanout lines achieve signal connections between the driving chip and the display panel.

Figure 2:
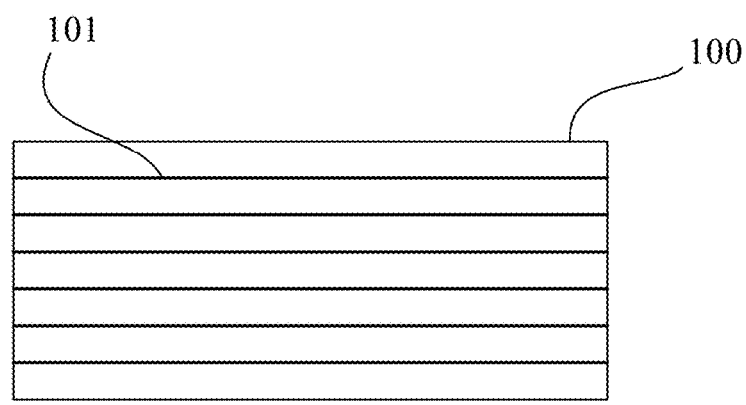
FIG. 2 is a schematic view illustrating a structure of a conventional wiring board.

FIG. 2 is a schematic view illustrating a structure of a conventional wiring board. The conventional wiring board 100 is provided with a plurality of fanout lines 101 formed by conductive materials on one surface of the substrate. Due to an identical resistivity but different lengths among respective fanout lines 101, there existed a signal transmission delay problem.

FIGS. 3-7 are schematic views illustrating structures of wiring boards according to embodiments of the present disclosure. According to embodiments of the present disclosure, the wiring board is used to connect a driving chip 200 and a display panel 300; signal output ends on the driving chip 200 and signal input ends on the display panel 300 are arranged in pairs; and the wiring board 100 includes fanout lines 101 which is each configured to connect a pair of signal output end and the signal input end. The wiring board 100 includes a substrate (not shown); a plurality of segments of first connection lines 1011 having first resistivity and arranged on a first surface of the substrate; a plurality of segments of second connection lines 1012 having second resistivity and arranged on a second surface of the substrate opposite to the first surface. At least parts of the fanout lines 101 are formed by connecting the first connection lines 1011 and the second connection lines 1012. The first connection lines 1011 and the second connection lines 1012 may be made of metal materials such as copper, iron, etc. And the substrate may be made of certain kinds of suitable materials. For example, the substrate, when being applied to a flexible display panel, may be made of flexible materials such as resin, plastics, etc. In embodiments of the present disclosure, specifically a conductive thin film layer may be formed on a surface of the substrate first, and then an etching process may be performed on the conductive thin film layer, so as to form the plurality of segments of the first connection lines or the second connection lines.

Resistivity is a parameter for measuring resistance of materials, and refers to a resistance of a conductive line having one meter length and one square meter sectional area under a normal temperature (20° C.). In this embodiment of the present disclosure, the first connection lines are each made of a material having the first resistivity; and the second connection lines are each made of a material having the second resistivity. Due to difference between the first resistivity and the second resistivity, resistances of respective fanout lines can be controlled, so as to enable RC delay on signals transmitted on respective lines to be the same, thereby causing time duration for transmitting signals on respective lines to be the same too. For example, the first connection lines may be copper lines; and the second connection lines may be iron lines. In this case, even though lengths of fanout lines are different, resistances of respective fanout lines can also be controlled according to a ratio between the first connection lines and the second connection lines.

Figure 3:
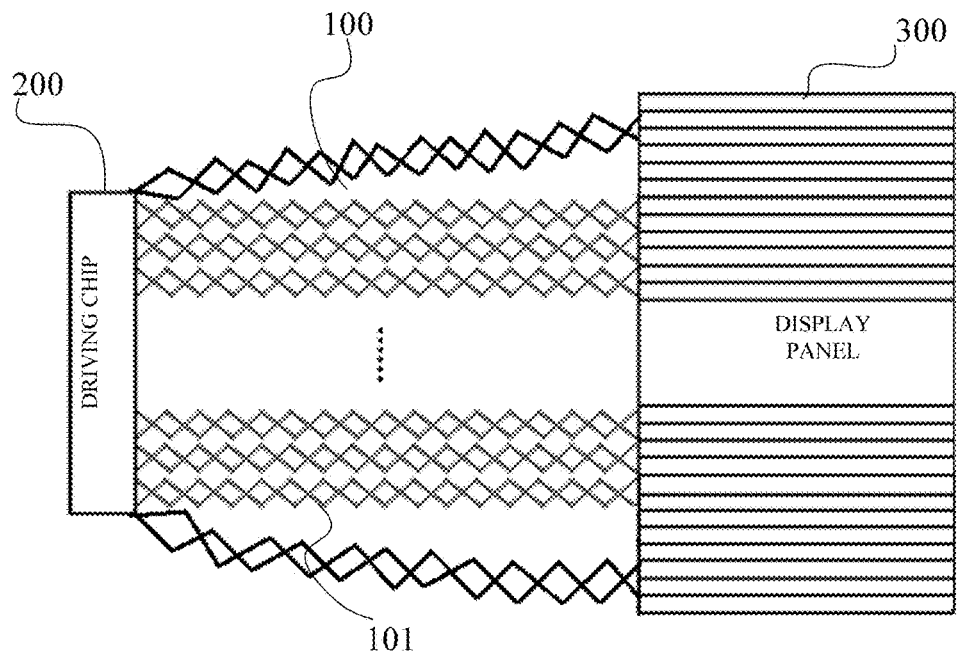
FIG. 3 is a schematic view illustrating a structure of a wiring board according to an embodiment of the present disclosure.

As shown in FIG. 3, a size of the display panel 300 is far larger than that of the driving chip 200. In this case, lengths of respective fanout lines 101 between the driving chip 200 and the display panel 300 are different. Assuming that respective fanout lines 101 are made of a material having the same resistivity, time durations for transmitting signals on respective fanout lines 101 are proportional to the lengths of the fanout lines 101. Under this circumstance, when respective gate lines are driven, transmission delay will occur, which imposes adverse impact on uniformity of the display panel. In order to solve this problem, at least parts of the fanout lines 101 are formed by connecting the first connection lines 1011 and the second connection lines 1012 having different resistivity on different surfaces of the substrate. Due to different resistivity between the first connection lines 1011 and the second connection lines 1012, resistances of respective fanout lines 101 can be controlled, such that time duration for transmitting signals on respective fanout lines 101 can be controlled. For example, time duration for transmitting signals on different fanout lines 101 can be adjusted to be the same, by enabling different fanout lines 101 having different lengths to have the same resistance.

Figure 4:
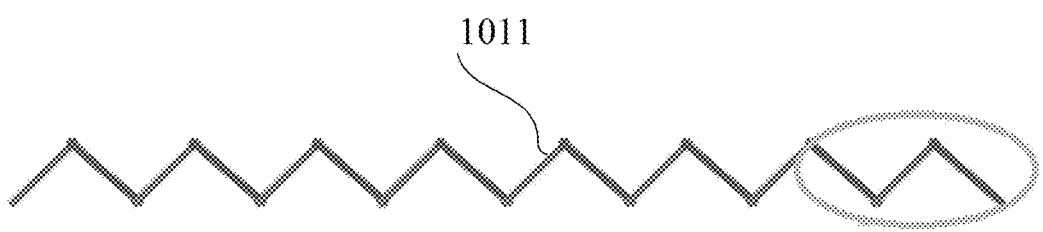
FIG. 4 is a schematic view illustrating one fanout line shown in FIG. 3.
Figure 5:
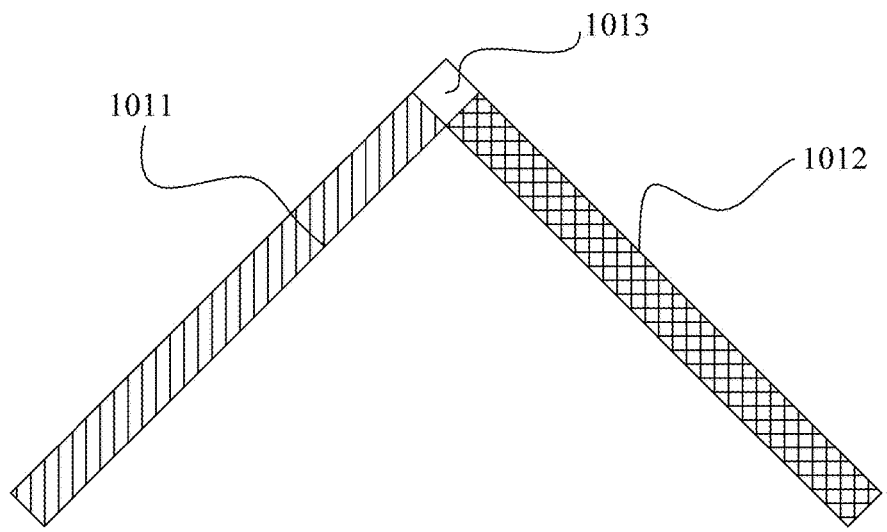
FIG. 5 is a schematic view illustrating a part of the fanout line shown in FIG. 4.

As shown in FIGS. 4-5, structures of fanout lines according to an embodiment of the present disclosure have been illustrated respectively. The fanout lines shown in FIG. 4 have a bent shape, and a predetermined angle is formed between at least parts of adjacent segments of the connection lines. Alternatively, the predetermined angle ranges from 30 degrees to 150 degrees. Such a wiring board can be applied to a flexible display panel. When the display panel is bent, there is an angle between a tension on respective fanout lines and an extension direction of the segments of the fanout lines, which mitigates the tension imposed on respective segments of the connection lines, thereby reducing damage on the segments of metal lines when being bent.

FIG. 5 illustrates parts of the fanout lines. The parts of the fanout lines include two segments, in which the first segment is the first connection lines 1011, and the second segment is the second connection lines 1012. The first segment 1011 is on a first surface of the substrate, the segment 1012 is on a second surface of the substrate, and the first segment 1011 and second segment 1012 are connected via a via-hole 1013. In this embodiment of the present disclosure, the wiring board and the display panel are formed integrally, the first connection lines and the second connection lines are formed by an etching process, and the first connection lines and/or the second connection lines are arranged at a certain angle with respect to electrode lines within the display panel. Specifically, the first connection lines and/or the second connection lines are arranged at a certain angle with respect to gate lines, data lines or common electrode lines within the display panel.

Figure 6:
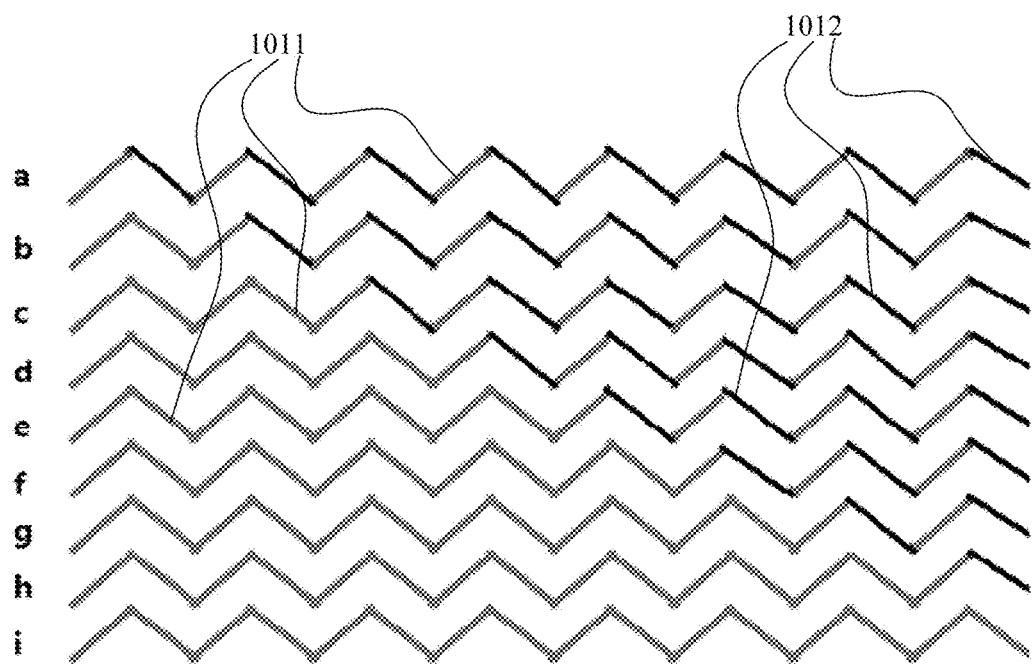
FIG. 6 is a schematic view illustrating a fanout lines layout according to an embodiment of the present disclosure.

FIG. 6 is a schematic diagram illustrating a fanout lines layout according to an embodiment of the present disclosure. As shown in FIG. 6, the fanout lines in this embodiment include nine (9) pieces of fanout lines, as shown by fanout lines a-i shown in FIG. 6. The fanout line i consists of sixteen (16) segments of the first connection lines 1011 on the first surface of the substrate, and there is a certain angle between adjacent first connection lines 1011. On the other hand, the fanout line h consists of fifteen (15) segments of the first connection lines 1011 (segments having lighter color, which is the same as below) and one (1) segment of the second connection line 1012 (segments having darker color, which is the same as below) on the second surface of the substrate. This segment of the second connection line 1012 is connected with one segment of the first connection lines 1011 via a via-hole. From the fanout line g to the fanout line a, the number of the first connection lines 1011 within the fanout lines becomes smaller and smaller, while the number of the second connection lines 1012 within the fanout lines becomes larger and larger.

Figure 7:
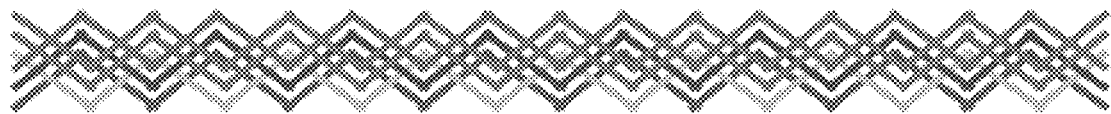
FIG. 7 is a schematic view illustrating a fanout lines layout according to another embodiment of the present disclosure.

FIG. 7 is a schematic diagram illustrating a fanout lines layout according to another embodiment of the present disclosure. In FIG. 7, there are six (6) fanout lines according to this embodiment, in which connection lines of a plurality of the fanout lines at least partially overlap each other at an identical location on the substrate. Six (6) fanout lines are arranged very closely according to this embodiment, which reduces space occupied by the fanout lines and saves space on the substrate.

According to another embodiment of the present disclosure, a flexible display panel having the above wiring board is provided. The substrate of the wiring board is made of flexible materials such as resin, plastics, etc. A plurality of segments of the first connection lines and the second connection lines is formed on two surfaces of the flexible substrate by an etching process. At least parts of the fanout lines are formed by connecting the first connection lines and the second connection lines.

According to yet another embodiment of the present disclosure, a display device having the above flexible display panel is provided. The display device adopts any one of the flexible display panel according to embodiments of the present disclosure. The display device may be any products or any elements having display function, including a liquid crystal display (LCD) panel, an electronics paper, an organic light-emitting diode (OLED) display panel, a mobile phone, a tablet computer, a television (TV), a monitor, a laptop computer, a digital frame, a navigator, etc.

In embodiments of the present disclosure, at least parts of the fanout lines are formed by connecting the first connection lines and the second connection lines having different resistivity on different surfaces of the substrate. Due to different resistivity between the first connection lines and the second connection lines, it is achievable to realize that the fanout lines having different lengths can have the same resistance or the desired resistance, which in turn controls time duration for transmitting signals on respective fanout lines having different lengths according to real needs.

The above are merely the preferred embodiments of the present disclosure and shall not be used to limit the scope of the present disclosure. It should be noted that, a person skilled in the art may make improvements and modifications without departing from the principle of the present disclosure, and these improvements and modifications shall also fall within the scope of the present disclosure.

What is claimed is:

1. A wiring board which is used to connect a driving chip and a display panel, wherein signal output ends on the driving chip and signal input ends on the display panel are arranged in pairs; and the wiring board comprises fanout lines each of which is configured to connect a pair of the signal output end and the signal input end, wherein the wiring board comprises a substrate;
a plurality of segments of first connection lines having first resistivity is arranged on a first surface of the substrate;
a plurality of segments of second connection lines having second resistivity is arranged on a second surface of the substrate opposite to the first surface; and
at least parts of the fanout lines are formed by connecting the first connection lines and the second connection lines, wherein connection lines of one of the fanout lines at least partially overlap connection lines of another one of the fanout lines at an identical location on the substrate.

2. The wiring board according to claim 1, wherein a predetermined angle is formed between at least parts of adjacent segments of the connection lines of the fanout lines.

3. The wiring board according to claim 2, wherein the predetermined angle ranges from 30 degrees to 150 degrees.

4. The wiring board according to claim 3, wherein the substrate is made of a flexible material.

5. The wiring board according to claim 2, wherein the first connection lines and/or the second connection lines of the fanout lines are arranged at a certain angle with respect to electrode lines within the display panel.

6. The wiring board according to claim 5, wherein the substrate is made of a flexible material.

7. The wiring board according to claim 2, wherein the substrate is made of a flexible material.

8. The wiring board according to claim 1, wherein the first connection lines and the second connection lines of the fanout lines are connected via a via-hole.

9. The wiring board according to claim 8, wherein the substrate is made of a flexible material.

10. The wiring board according to claim 1, wherein the first connection lines are each made of a material having the first resistivity; and the second connection lines are each made of a material having the second resistivity other than the first resistivity.

11. The wiring board according to claim 10, wherein the first connection lines are copper lines; and the second connection lines are iron lines.

12. The wiring board according to claim 11, wherein the substrate is made of a flexible material.

13. The wiring board according to claim 10, wherein the substrate is made of a flexible material.

14. The wiring board according to claim 1, wherein the substrate is made of a flexible material.

15. The wiring board according to claim 14, wherein the flexible material is resin or plastics.

16. The wiring board according to claim 1, wherein the plurality of segments of the connection lines of the fanout lines is formed from a conductive film layer by an etching process.

17. A flexible display panel, comprising the wiring board according to claim 1.

18. A display device, comprising the flexible display panel according to claim 17.

* * * * *